(12) United States Patent
Kim (10) Patent No.: US 11,569,474 B2
(45) Date of Patent: Jan. 31, 2023

(54) ORGANIC LIGHT-EMITTING DIODE (OLED) DISPLAY AND METHOD OF FABRICATING THE SAME

(71) Applicant: Samsung Display Co., Ltd., Yongin-si (KR)

(72) Inventor: Do-Hoon Kim, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 55 days.

(21) Appl. No.: 17/338,385

(22) Filed: Jun. 3, 2021

(65) Prior Publication Data

US 2021/0296612 A1 Sep. 23, 2021

Related U.S. Application Data

(62) Division of application No. 15/925,306, filed on Mar. 19, 2018, now Pat. No. 11,056,670, which is a
(Continued)

(30) Foreign Application Priority Data

Dec. 16, 2013 (KR) .......................... 10-2013-0156147

(51) Int. Cl.
*H01L 51/52* (2006.01)
*H01L 51/00* (2006.01)
*H01L 27/32* (2006.01)

(52) U.S. Cl.
CPC ...... *H01L 51/5246* (2013.01); *H01L 51/0023* (2013.01); *H01L 27/3276* (2013.01); *H01L 2251/566* (2013.01)

(58) Field of Classification Search
None
See application file for complete search history.

(56) References Cited

U.S. PATENT DOCUMENTS

2003/0107315 A1 6/2003 Chen et al.
2004/0080263 A1 4/2004 Yamazaki et al.
(Continued)

FOREIGN PATENT DOCUMENTS

JP 2013-65546 A 4/2013
KR 10-2003-0049540 A 6/2003
(Continued)

OTHER PUBLICATIONS

Korean Notice of Allowance, with English Translation, dated Jan. 29, 2020, for corresponding Korean Patent Application No. 10-2013-0156147 (7 pages).
(Continued)

*Primary Examiner* — Michelle Mandala
(74) *Attorney, Agent, or Firm* — Lewis Roca Rothgerber Christie LLP (57) ABSTRACT

An organic light-emitting diode (OLED) display and method of fabricating the same are disclosed. In one aspect, the OLED display includes a first substrate including a display area and a peripheral area surrounding the display area. The display area includes a plurality of pixels each including an OLED and the peripheral area includes a signal driver electrically connected to the pixels. A conductive layer is formed over the signal driver and on opposing sides of the signal driver and a second substrate is formed over the first substrate. The OLED display further includes a first seal interposed between the first and second substrates in the peripheral area and substantially sealing the first and second substrates and a second seal surrounding the first seal and formed over the signal driver.

7 Claims, 4 Drawing Sheets

Related U.S. Application Data division of application No. 14/559,766, filed on Dec. 3, 2014, now Pat. No. 9,954,197.

(56) References Cited

U.S. PATENT DOCUMENTS

| | | |
|---|---|---|
| 2005/0248270 A1 | 11/2005 | Ghosh et al. |
| 2007/0170455 A1* | 7/2007 | Choi .................. H01L 51/5246 257/E33.056 |
| 2008/0106194 A1 | 5/2008 | Logunov et al. |
| 2009/0218932 A1 | 9/2009 | Wang |
| 2010/0062553 A1* | 3/2010 | Sung .................. H01L 27/3276 257/E33.056 |
| 2012/0248466 A1 | 10/2012 | Park |
| 2012/0287026 A1* | 11/2012 | Masuda .............. H01L 27/3272 156/275.7 |
| 2012/0313128 A1 | 12/2012 | Yokoyama et al. |
| 2013/0069059 A1 | 3/2013 | Yamazaki |
| 2013/0113843 A1 | 5/2013 | Yamazaki |
| 2014/0054582 A1 | 2/2014 | Yamazaki et al. |
| 2015/0219944 A1 | 8/2015 | Mitsumoto et al. |

FOREIGN PATENT DOCUMENTS

| | | |
|---|---|---|
| KR | 10-2004-0079048 A | 9/2004 |
| KR | 10-2005-0090259 A | 9/2005 |
| KR | 10-0688788 B1 | 2/2007 |
| KR | 10-2008-0041558 A | 5/2008 |
| KR | 10-2008-0105475 A | 12/2008 |
| KR | 10-2010-0127247 A | 12/2010 |
| KR | 10-2012-0039375 A | 4/2012 |
| KR | 10-2012-0077470 A | 7/2012 |
| KR | 10-2012-0117914 A | 10/2012 |
| KR | 10-2012-0137264 A | 12/2012 |

OTHER PUBLICATIONS

Korean Office action, with Machine English Translation, dated Nov. 21, 2019, for corresponding Korean Patent Application No. 10-2013-0156147 (10 pages).

Partial English translation of the relevant portion of KR 10-2008-0105475 A (2 pages).

Partial English translation of the relevant portion of KR 10-2012-0039375 A (2 pages).

Partial English translation of the relevant portion of KR 10-2012-0077470 A (1 page).

* cited by examiner

ORGANIC LIGHT-EMITTING DIODE (OLED) DISPLAY AND METHOD OF FABRICATING THE SAME

CROSS-REFERENCE TO RELATED APPLICATIONS

This application is a divisional of U.S. application Ser. No. 15/925,306, filed on Mar. 19, 2018, which is a divisional of application Ser. No. 14/559,766, filed Dec. 3, 2014, now U.S. Pat. No. 9,954,197, issued on Apr. 24, 2018, which claims priority to and the benefit of Korean Patent Application No. 10-2013-0156147, filed on Dec. 16, 2013, in the Korean Intellectual Property Office, the entire contents of all of which are incorporated herein by reference in their entirety.

BACKGROUND

Field

The described technology generally relates to an organic light-emitting diode (OLED) display and method of fabricating the same.

Description of the Related Technology

OLED displays device are flat panel displays including an organic emission layer interposed between opposing electrodes. Electrons injected from one electrode are combined with holes injected from the other electrode in the organic emission layer and light emission molecules of the organic emission layer are excited. When the excited light emission molecules return to a ground state, they emit light.

OLED displays have favorable qualities such as excellent visibility, light weight, thin profile, and low power consumption, and are thus attracting attention as a next generation display device.

Organic light-emitting diode (OLED) displays can experience degradation in performance when ambient oxygen or moisture from the environment enters the display. In order to prevent environmental reactions, OLED displays are sealed with an inorganic sealant, such as glass frit. It should be noted that when frit is used as a sealant, the space between two substrates such as glass plates can be substantially completely sealed after curing the fit. Thus, it is generally unnecessary to use an absorbent material in an OLED display sealed with frit.

When fit is used as a seal in an OLED display, laser or infrared radiation is used to cure the fit seal. In order to minimize damage to other components of the display (such as signal drivers), the fit seal is spaced apart from the other components so that the laser or infrared radiation is not directly radiated onto the other components.

SUMMARY OF CERTAIN INVENTIVE ASPECTS

One inventive aspect is an OLED display having an improved reliability and mechanical strength to substantially prevent damage to the OLEDs due to external impacts and a method of fabricating the same.

Another aspect is an OLED display including a first substrate including a display area in which an OLED formed of a first electrode, a second electrode, and an organic emission layer interposed between the two electrodes is formed, and a non-display area formed at an outer side of the display area and including a driver driving the OLED, a conductive layer patterned so as to surround a lateral surface of the driver in the non-display area, a first seal provided between the non-display area of the first substrate and the second substrate and configured to seal the first and second substrates, and a second seal located at an outer side of the first seal and formed on the driver surrounded by the patterned conductive layer.

The first and second seals may be formed of different materials.

The first seal may be glass frit.

The second seal may be epoxy resin.

The conductive layer may include an opening exposing a part of a passivation layer provided at the driver.

The conductive layer may be formed of the same material as the first electrode.

The conductive layer and the first electrode may be formed of transparent conductive materials.

The conductive layer and the first electrode may be formed of opaque conductive materials.

Another aspect is a method of fabricating an OLED display including providing a first substrate including a display area in which an OLED formed of a first electrode, a second electrode, and an emission layer is formed, and a non-display area formed at an outer side of the display area, forming a first metal pattern on the non-display area of the first substrate, forming an insulating layer on the first metal pattern, forming a second metal pattern overlapping the first metal pattern on the insulating layer, forming a passivation layer on the second metal pattern and patterning the passivation layer so as to surround all of the first and second metal patterns, forming a conductive layer formed on the patterned passivation layer and patterned so as to expose a part of the passivation layer and surround the remaining portion, forming a first seal between the display area and the non-display area, forming a second seal located at an outer side of the first seal on the patterned conductive layer and the partially exposed passivation layer, bonding a second substrate opposed to the first substrate to the first substrate, and curing the second seal formed between the first and second substrates.

The first and second seals may be formed of different materials.

The first seal may be glass frit.

The second seal may be epoxy resin.

The conductive layer may be formed of the same material as that of the first electrode of the OLED.

The method may further include bonding the first and second substrates by irradiating laser light to the first seal.

When laser light is irradiated to the first seal, the passivation layer located under the first seal may be burned, so that a hole exposing a part of the insulating layer may be formed, and the first seal may be formed inside the hole.

Another aspect is an OLED display including a first substrate including a display area and a peripheral area surrounding the display area, wherein the display area includes a plurality of pixels each including an OLED and wherein the peripheral area includes a signal driver electrically connected to the pixels, a conductive layer formed over the signal driver and on opposing sides of the signal driver, a second substrate formed over the first substrate, a first seal interposed between the first and second substrates in the peripheral area and substantially sealing the first and second substrates, and a second seal surrounding the first seal and formed over the signal driver.

The first and second seals are formed of different materials. The first seal is formed at least in part of glass frit. The second seal is formed at least in part of an epoxy resin. The signal driver includes a passivation layer and the conductive layer has an opening formed over a portion of the passivation layer. Each of the OLEDs includes a pixel electrode and the conductive layer is formed of the same material as the pixel electrodes. Each of the conductive layer and the pixel electrodes is formed of a transparent conductive material. Each of the conductive layer and the pixel electrodes is formed of an opaque conductive material.

Another aspect is a method of fabricating an OLED display including providing a first substrate including a display area and a peripheral area surrounding the display area, forming a first metal pattern on the peripheral area, forming an insulating layer over the first metal pattern, forming a second metal pattern substantially overlapping the first metal pattern over the insulating layer, forming a passivation layer over the second metal pattern, patterning the passivation layer so as to substantially surround the first and second metal patterns, forming a conductive layer over the patterned passivation layer and on opposing sides of the patterned passivation layer, patterning the conductive layer to expose a portion of the passivation layer, forming a first seal in the peripheral area, forming a second seal at least partially overlapping the exposed portion of the passivation layer and surrounding the first seal, attaching a second substrate to the first substrate, and curing the second seal.

The first and second seals are formed of different materials. The first seal is formed of glass frit. The second seal is formed of an epoxy resin. The method further includes forming an OLED in the display area, wherein the OLED includes a pixel electrode and wherein the conductive layer is formed of the same material as the pixel electrode. The attaching includes irradiating laser light onto the first seal. The irradiating includes burning the passivation layer located under the first seal so that a hole is formed exposing a portion of the insulating layer and wherein the first seal is located inside the hole.

Another aspect is an OLED display including a substrate including a display area and a peripheral area surrounding the display area, a plurality of pixels formed in the display area, a signal driver formed in the peripheral area and electrically connected to the pixels, a first seal formed in the peripheral area surrounding the pixels, and a second seal at least partially overlapping the signal driver and surrounding the first seal.

The height of the first seal is greater than that of the second seal, wherein the height is measured in a direction substantially perpendicular to the substrate. The width of the first seal is less than that of the second seal, wherein the width is measured in a direction substantially parallel to the substrate. The first and second seals do not contact each other. The first and second seals are formed of different materials.

DETAILED DESCRIPTION OF CERTAIN INVENTIVE EMBODIMENTS

Exemplary embodiments will now be described more fully hereinafter with reference to the accompanying drawings; however, they may be embodied in different forms and should not be construed as limited to the embodiments set forth herein. Rather, these embodiments are provided so that this disclosure will be thorough and complete and will fully convey the scope of the embodiments to those skilled in the art. The term "substantially" as used in this disclosure means completely, almost completely, or to any significant degree.

In the drawings, the dimensions may be exaggerated for clarity of illustration. It will be understood that when an element is referred to as being "between" two elements, it can be the only element between the two elements, or one or more intervening elements may also be present. Like reference numerals refer to like elements throughout.

Other detailed matters of the exemplary embodiments are included in the detailed description and the drawings.

Various advantages and features of the described technology and methods accomplishing the same will become apparent from the following detailed description of exemplary embodiments with reference to the accompanying drawings.

However, the described technology is not limited to the exemplary embodiments set forth below and may be embodied in various other forms. The present exemplary embodiments are intended to render the description of the described technology complete and are set forth to provide a complete understanding of the scope of the described technology to a person with ordinary skill in the technical field to which the described technology pertains. The described technology will only be defined by the scope of the claims. Like reference numerals indicate like elements throughout the specification and drawings.

The size and thickness of the components shown the drawings may be exaggerated for better understanding and ease of description and the described technology is not limited to the examples shown in the drawings.

In the drawings, the thicknesses may be enlarged to clearly express various portions and areas. It will be understood that when an element such as a layer, film, region, or substrate is referred to as being "on" another element, it can be directly on the other element or intervening elements may also be present.

Hereinafter, an OLED display according to an exemplary embodiment and a method of fabricating the same will be described with reference to the drawings.

Hereinafter, characteristics of first and second seals will be described while schematically describing an OLED included on a substrate with reference to FIGS. 1 and 2.

Figure 1:
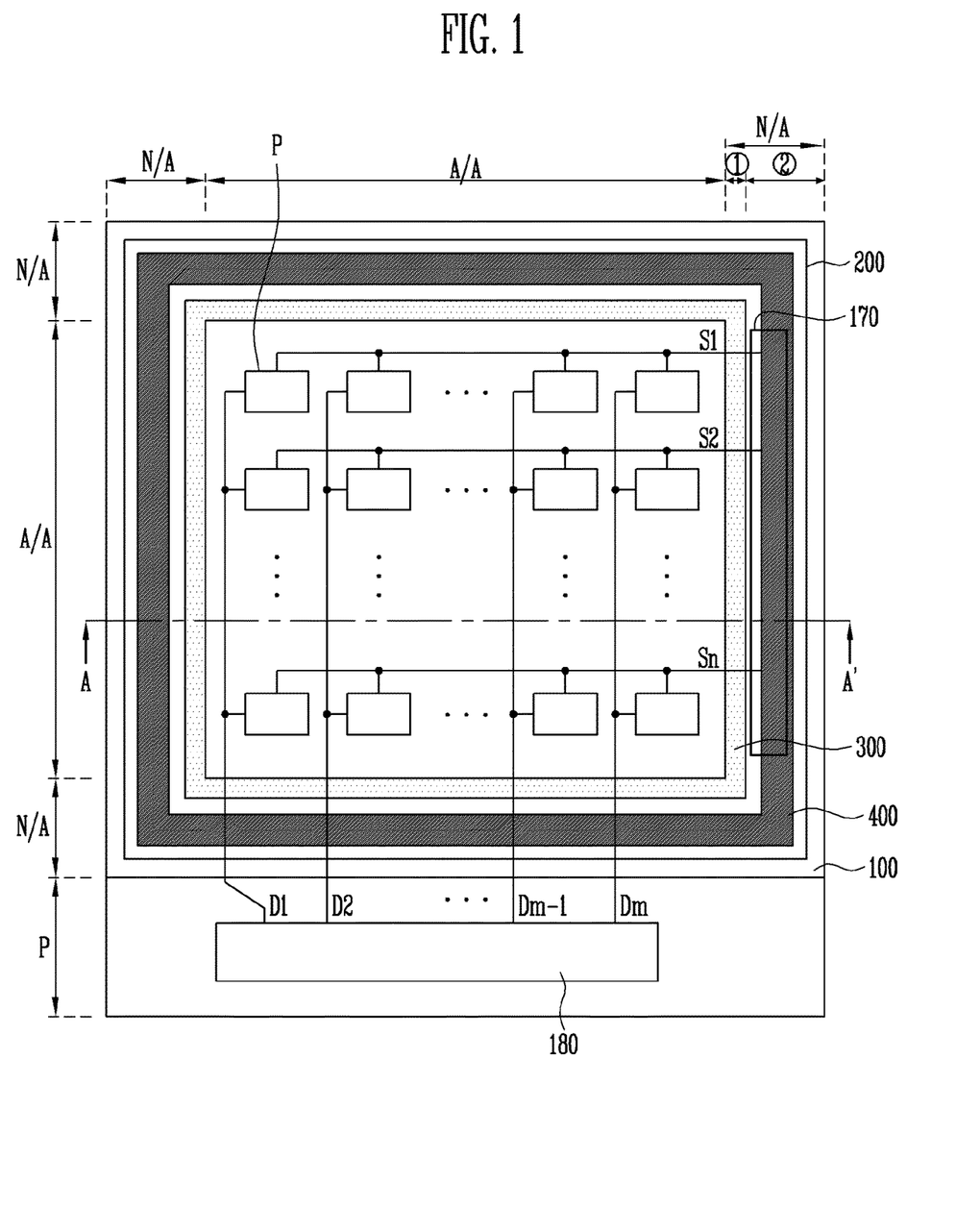
FIG. 1 is a top plan view schematically illustrating an OLED display according to an exemplary embodiment.
Figure 2:
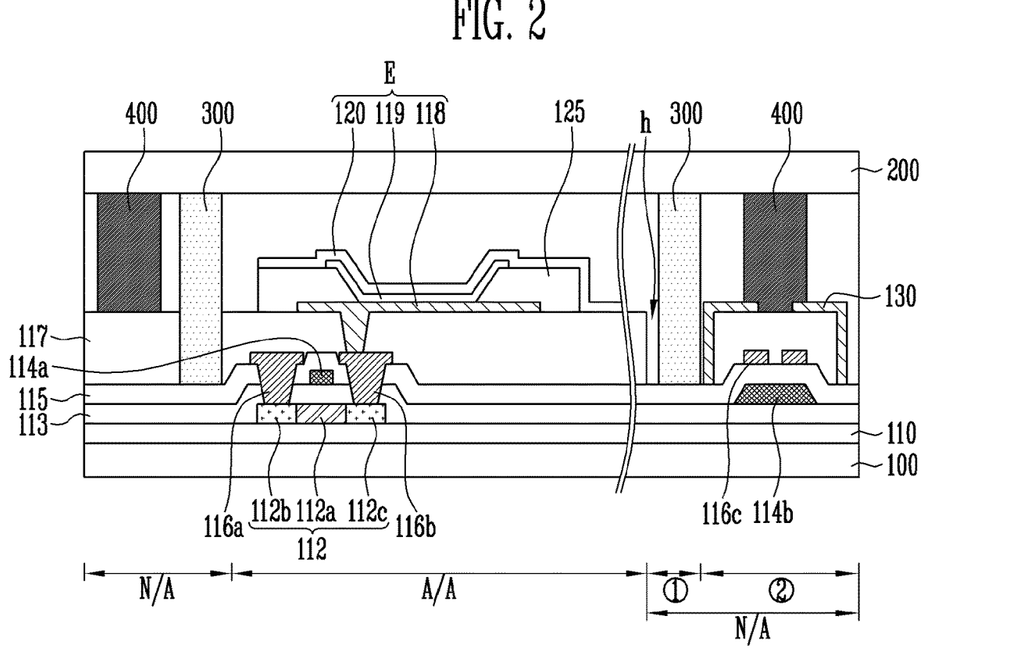
FIG. 2 is a cross-sectional view illustrating the OLED display of FIG. 1 taken along line A-A'.

Referring to FIGS. 1 and 2, an OLED display includes a first substrate 100 on which an OLED E and driving elements (a thin film transistor or a capacitor (not illustrated)) for driving the OLED E are formed. The OLED display also includes a second substrate 200 opposing the first substrate 100, a first seal 300 for sealing the first and second substrates 100 and 200, and a second seal 400 located at an outer side of the first seal 300 and improving the mechanical strength of the first and second substrates 100 and 200. For example, the second seal 400 surrounds the first seal 300.

The first substrate 100 is divided into an active area A/A (also referred to as a display area) displaying images and a non-display area N/A (also referred to as a peripheral area) surrounding the edge of the active area A/A.

The active area A/A includes a plurality of scan lines S1 to Sn extending in a first direction and a plurality of data lines D1 to Dm extending in a second direction crossing the first direction. Pixel regions P are defined at the intersections between the scan lines S1 to Sn and the data lines D1 to Dm. Further, the active area A/A may further include power lines (not illustrated) spaced apart from the data lines D1 to Dm to provide the pixel regions P with a power source voltage or the like.

The non-display area N/A may be divided based on the locations of driving circuits or other components. For example, as illustrated in FIGS. 1 and 2, when a first circuit unit or a scan driver 170 driving the scan lines S1 to Sn is formed at a right side of the first substrate 100, the non-display area N/A located at the right side of the first substrate 100 is divided into first and second non-display areas ① and ②.

The first substrate 100 further includes a pad part P in which a second circuit unit or data driver 180 driving the data lines D1 to Dm is located.

The first and second substrates 100 and 200 may be substrates formed of glass, but are not limited thereto, and may be substrates formed of metal or plastic.

The active area A/A of the first substrate 100 includes a buffer layer 110, a semiconductor layer 112 formed on the buffer layer 110 and including an active layer 112a and source and drain regions 112b and 112c. The active area A/A also includes a gate insulating layer 113 formed on the semiconductor layer 112, a gate electrode 114a formed on one region of the gate insulating layer 113 and having a size corresponding to the width of the active layer 112a, and an interlayer insulating layer 115 formed on the gate electrode 114a. The active area A/A further includes source and drain electrodes 116a and 116b formed on the interlayer insulating layer 115, and a passivation layer 117 formed on the source and drain electrodes 116a and 116b.

Further, the first substrate 100 further includes a first electrode 118 formed on the passivation layer 117, a pixel defining layer 115 including an opening exposing one region of the first electrode 118, an organic emission layer 119 formed in the opening of the pixel defining layer 125, and a second electrode 120 formed on the organic emission layer 119 and the pixel defining layer 125.

The first and second electrodes 118 and 120 and the organic emission layer 119 interposed therebetween form the OLED E.

Further, the first circuit unit 170 is formed in the second non-display area N/A ② of the first substrate 100. The first circuit unit 170 includes the buffer layer 110 formed on the first substrate 100, the gate insulating layer 113 formed on the buffer layer 110, and a first metal pattern 114b formed on the gate insulating layer 113. The first circuit unit 170 also includes an interlayer insulating layer 115 formed on the first metal pattern 114b, second metal patterns 116b formed on the interlayer insulating layer 115 and spaced apart from each other at a predetermined interval, and the passivation layer 117 formed on the second metal patterns 116b.

The first metal pattern 114b of the first circuit unit 170 is formed of the same material and by the same process as the gate electrode 114a of the active area A/A. The second patterns 116c are formed of the same material and by the same process as the source and drain electrodes 116a and 116b of the active area A/A.

The first circuit unit 170 further includes a conductive layer 130 including an opening exposing a part of the passivation layer 117 and surrounding a lateral side of the passivation layer 117.

The conductive layer 130 of the first circuit unit 170 is formed of the same material as the first electrode 118 of the OLED E of the active area A/A.

The first seal 300 is formed of glass frit to block the inflow of moisture and oxygen from the environment and is formed in the first non-display area N/A ①. The first seal 300 forms a rectangular closed loop so as to surround the display area 101 of the first substrate 100.

The first seal 300 may be selectively applied onto the non-display area N/A by using a publicly known method. Examples of methods for applying the first seal include application methods, such as dispense and inkjet methods, and printing methods, such as a screen printing method. When applying the first seal 300 to a large substrate, an application method such as a dispense method can be used.

A glass material used as glass frit may include one or more compounds selected from the group of, for example, magnesium oxide, calcium oxide, barium oxide, lithium oxide, sodium oxide, potassium oxide, boric oxide, vanadium oxide, zinc oxide, tellurium oxide, aluminum oxide, silicon dioxide, lead oxide, tin oxide, phosphorous pentoxide, ruthenium oxide, iron oxide, copper oxide, titanium oxide, tungsten oxide, bismuth oxide, antimony oxide, lead borate glass, tin phosphoric acid glass, vanadate, and borosilicate glass.

The glass frit can be heated by laser irradiation curing. Light absorbent material can be added to the glass frit to increase the heat transferred from the laser light to the glass frit. The optimum absorbent material may be selected and used in accordance with a wavelength of the laser light.

The second seal 400 is formed to be spaced apart from the first seal 300 by a predetermined interval in the non-display area N/A. Particularly, the second seal 400 is formed so as to overlap the first circuit unit 170 in the non-display area N/A ② located at the right side of the first substrate 100 and to be spaced apart from the first seal 300 by a predetermined interval at the outer side of the first seal 300.

The second seal 400 may be formed of, for example, an organic material. One or more material selected from the group of epoxy acrylate and silicon materials (for example, bisphenol A epoxy, cyclo-aliphatic epoxy resin, phenyl silicon resin or rubber, and acrylic epoxy resin) can be used as the organic material. In some embodiments, the second seal 400 is formed of an epoxy resin having excellent adhesion with a glass material between the first and second substrates 100 and 200.

The second seal 400 is formed of epoxy resin, so that the second seal 400 increases the sealing effect together with the first seal 300 when the first and second substrates 100 and 200 are bonded together, and can thereby effectively prevent the inflow of moisture and oxygen from the environment into the OLED E.

When impact is applied to the two substrates 100 and 200, even though the first seal 300 may be damaged due its fragile properties, the combination of the two substrates 100 and 200 maintain a seal since the second seal 400 is not damaged. As a result, the second seal 400 improves the mechanical strength of the two substrates 100 and 200.

Particularly, in OLED displays having a reduced size non-display area N/A, the width of the first seal 300 is decreased in accordance with the decreased size non-display area N/A. It can be difficult to effectively block the inflow of moisture and oxygen from the environments with such a first seal 300 and when an impact is applied to the OLED display, the first seal 300 can be easily broken due to its material properties, reducing the reliability of the OLED display.

According to at least one embodiment, the second seal 400 overlaps the first circuit unit 170 enabling a minimum process margin within the non-display area N/A to reduce the width corresponding to the area occupied by the first circuit unit 170. Accordingly, it is possible to solve the abovementioned problems associated with the decreased width of the first seal 300.

Further, the second seal 400 is formed overlapping the first circuit unit 170 in the second non-display area N/A ②. The second seal 400 can be formed along a boundary between adjacent cells on a mother panel and the mother panel can be cut along the second seal 400 to separate the adjacent cells. In these embodiments, the second seal 400 is formed in a cutting region and cut such that the first circuit unit 170 is not damaged in the cutting process.

Moreover, the conductive layer 130 is patterned so as to include an opening exposing a portion of the passivation layer 117 and surround an edge of the passivation layer 117. The second seal 400 is formed over the conductive layer 130 and the conductive layer 130 blocks the inflow of oxygen and moisture into the first circuit unit 170.

The conductive layer 130 is formed of the same material as the first electrode 118 and the adhesion between the conductive layer 130 and the second seal 400 formed of epoxy region deteriorates. According to at least one embodiment, the second seal 400 is in direct contact with the passivation layer 117 via an opening in the conductive layer 130, thereby improving adhesion with the second seal 400 in the second non-display area N/A ②.

Hereinafter, a method of fabricating the OLED display according to an exemplary embodiment will be described in detail.

FIGS. 3A to 3E are cross-sectional views sequentially illustrating a method of fabricating the OLED display of FIG. 2.

Figure 3A:
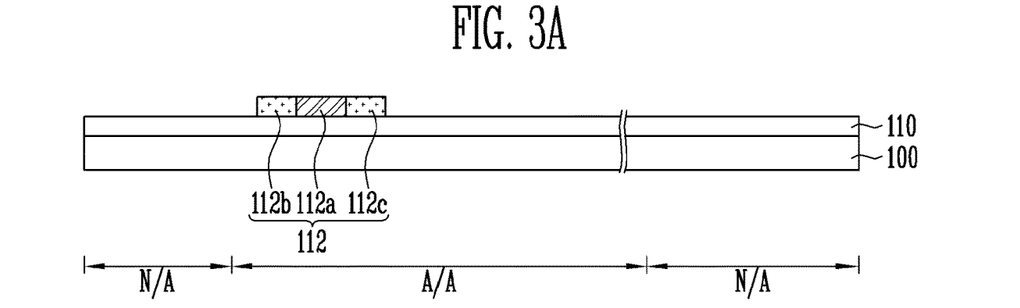
FIGS. 3A to 3E are cross-sectional views sequentially illustrating a process of fabricating the OLED display of FIG. 2.

Referring to FIG. 3A, the buffer layer 110 is formed on the first substrate 100 and the semiconductor layer 112 is formed in the active area A/A of the buffer layer 110. The semiconductor layer 112 is divided into the active layer 112a and source and drain regions 112b and 112c by performing an ion doping process on a predetermined region.

A material having excellent mechanical strength and stability is selected as the material of the first substrate 100 for forming the display. Examples of the material of the first substrate 100 includes a glass plate, a metal plate, a ceramic plate, or plastic (polycarbonate resin, acrylic resin, polyvinyl chloride resin, polyethylene terephthalate resin, polyimide resin, polyester resin, epoxy resin, silicon resin, and fluorine resin), but the material of the first substrate 100 is not limited thereto.

The buffer layer 110 may be formed in order to protect driving elements formed in a subsequent process from impurities, such as alkali ions, discharged from the first substrate 100, and may be omitted depending on the material used to form the first substrate 100.

Figure 3B:
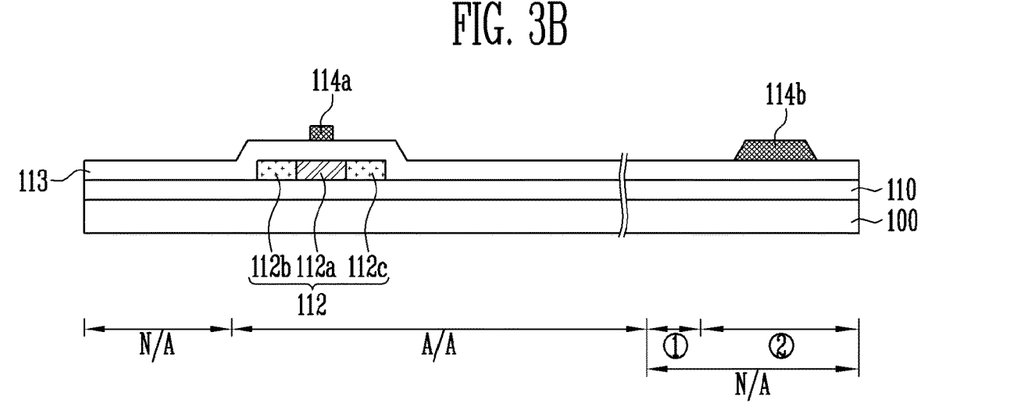

Next, as illustrated in FIG. 3B, the gate insulating layer 113 is formed on the first substrate 100 and the gate electrode 114a is formed on a region corresponding to the active layer 112a on the gate insulating layer 113. The first metal pattern 114b is formed of the same material as the gate electrode 114a and is simultaneously formed in the second non-display area N/A ②.

The gate insulating layer 113 is formed of a silicon oxide (SiOx) layer, a silicon nitride (SiNx) layer, or a dual layer thereof, and serves to insulate the gate electrode 114a from the semiconductor layer 112.

The gate electrode 114a and the first metal pattern 114b are conductive metal and may be one or more selected from the group of aluminum (Al), an aluminum alloy (Al alloy), tungsten (W), molybdenum (Mo), chrome (Cr), and titanium (Ti).

Figure 3C:
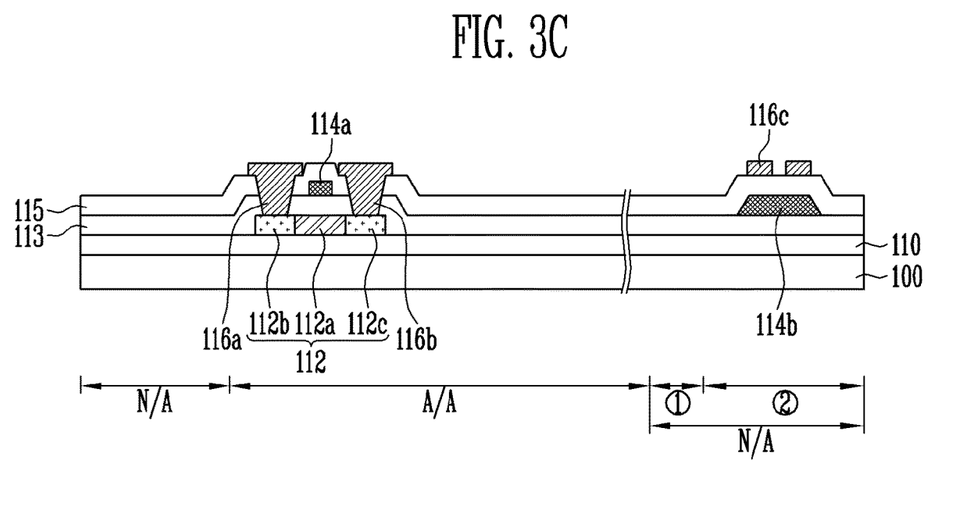

Subsequently, as illustrated in FIG. 3C, the interlayer insulating layer 115 is formed on the gate insulating layer 113 including the gate electrode 114a and the first metal pattern 114b. A through-hole is formed in at least one region of the gate insulating layer 113 and the interlayer insulating layer 115 in the active area A/A.

The source and drain electrodes 116a and 116b are formed to respectively connect to the source and drain regions 112b and 112c through via through-holes. The second metal patterns 116c are simultaneously formed in a region corresponding to the first metal pattern 114b in the second non-display area N/A ②.

The source and drain electrodes 116a and 116b and the second metal patterns 116c are formed of one or more material selected from the group of chrome (Cr), molybdenum (Mo), tungsten (W), molybdenum tungsten (MoW), titanium (Ti), aluminum (Al), and an aluminum alloy (Al alloy).

The semiconductor layer 112, the gate electrode 114a, and the source and drain electrodes 116a and 116b form a driving thin film transistor for driving the OLED E (see FIG. 2) and the first and second metal patterns 114b and 116c form the first circuit unit 170 (see FIG. 1).

Figure 3D:
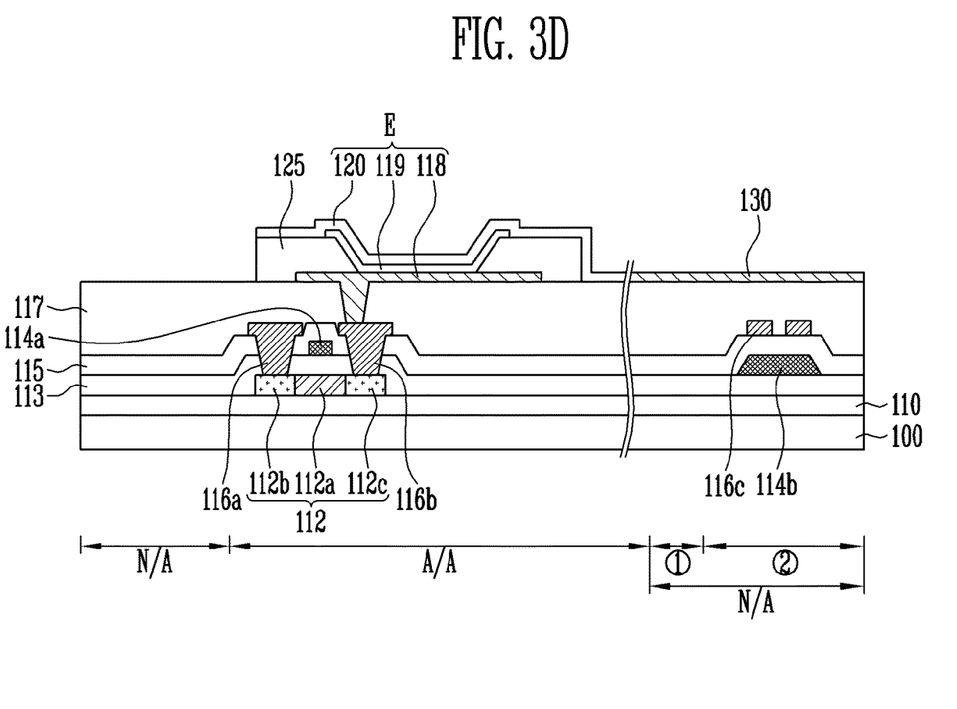

Next, as illustrated in FIG. 3D, the passivation layer 117 protecting the source and drain electrodes 116a and 116b and the second metal patterns 116c is formed on the first substrate 100. The passivation layer 117 planarizes the concave-convex portions (or step structures) formed by the thin film transistor and other components on the first substrate 100.

The passivation layer 117 may be formed of an organic insulating material, such as photo acryl or benzocyclobutene (BCB), or may be formed of a single layer, such as $SiO_2$, SiN, and SiON, or a stacked layer in which a plurality of single layers are stacked.

The first electrode 118 is electrically connected to the drain electrode 116b and is formed on the passivation layer 117. The conductive layer 130 is formed of the same material as that of the first electrode 118 and is simultaneously formed on the second non-display area N/A ②.

The pixel defining layer 125 is formed on the passivation layer 117 and on the first electrode 118. The pixel defining layer 125 includes an opening exposing a partial region and the opening is formed by a photo process. Next, the organic emission layer 119 is formed in the opening of the pixel defining layer 125 and the second electrode 120 is formed on the organic emission layer 119.

A low molecular or high molecular organic layer may be used as the organic emission layer 119. When the low molecular organic layer is used, the organic emission layer 119 may be formed by stacking a Hole Injection Layer (HIL), a Hole Transport Layer (HTL), an Emission Layer (EML), an Electron Transport Layer (ETL), and an Electron Injection Layer (EIL) in a single or complex structure.

The first electrode 118 serves as an anode electrode and is referred to as a pixel electrode. The second electrode 120 serves as a cathode electrode and is referred to as a common electrode. In other embodiments, the polarities of the first and second electrodes 118 and 120 are opposite to the aforementioned polarities.

In some embodiments, the OLED display is a bottom emission display in which images are viewed from through the first substrate 100. In these embodiments, the first electrode 118 is a transparent electrode and the second electrode 120 is a reflective electrode. The first electrode 118 may be formed of ITO, IZO, ZnO, or $In_2O_3$ having a high work function and the second electrode 120 may be formed of a metal having a small work function, for example, Ag, Mg, Al, Pt, Pd, Au, Ni, Nd, Ir, Cr, Li, Ca, or a combination thereof.

In other embodiments, the OLED display is a top emission display in which images are view through the second substrate 200. In these embodiments, the first electrode 118 is a reflective electrode and the second electrode 120 is a transparent electrode. The reflective electrode, that is, the first electrode 118 includes a reflective layer formed of Ag, Mg, Al, Pt, Pd, Au, Ni, Nd, Ir, Cr, Li, Ca, or a compound thereof, or ITO, IZO, ZnO, or $In_2O_3$ having a high work function. Further, the transparent electrode, that is, the second electrode 120 is formed by depositing a metal having a small work function, that is, Ag, Mg, Al, Pt, Pd, Au, Ni, Nd, Ir, Cr, Li, Ca, or a compound thereof, and then forming an auxiliary electrode layer or a bus electrode line formed of a transparent conductive layer, such as ITO, IZO, ZnO, or $In_2O_3$.

In yet other embodiments, the OLED display is a dual emission display and both of first and second electrodes 118 and 120 are formed as transparent electrodes.

The materials of the first and second electrodes 118 and 120 are not limited to the aforementioned materials and the first and second electrodes 118 and 120 may be formed of a conductive organic material or a conductive paste including conductive particles, such as Ag, Mg, or Cu. When the conductive paste is used, printing may be performed by an inkjet printing method, and after the printing, the conductive paste is heated to be formed as the electrode.

Figure 3E:
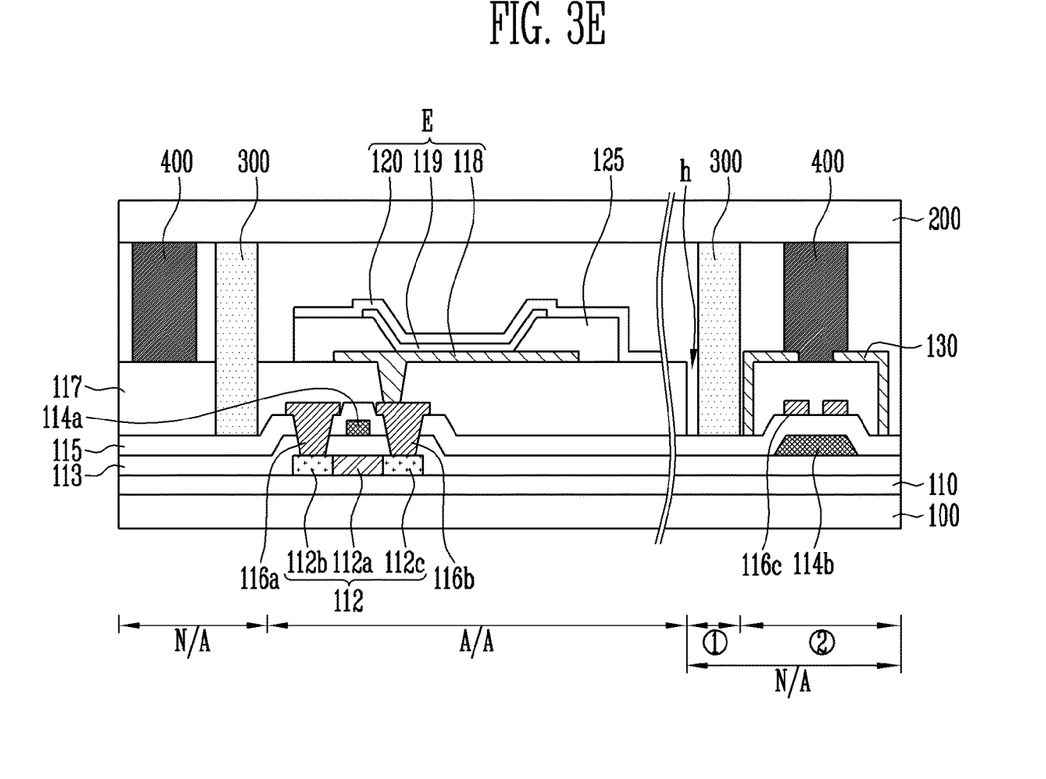

Next, as illustrated in FIG. 3E, the conductive layer 130 is patterned so as to include the opening exposing a portion of the passivation layer 117 in the non-display area N/A of the first substrate 100. The conductive layer 130 including the opening is finally formed to surround the lateral surfaces of the patterned passivation layer 117 in the second non-display area N/A ②.

Subsequently, the first seal 300 is formed at a border of the first substrate 100 and sealing the first and second substrates 100 and 200 and the second seal 400 is formed to be spaced apart from the first seal 300 by a predetermined interval at the outer side of the first seal 300. The two substrates 100 and 200 are bonded by attaching the second substrate 200 to the first substrate 100.

A curing process using laser is performed to cure the first seal 300. If the passivation layer 117 is located under or near the first seal 300 it is burned by the laser, forming a hole h through which a portion of the interlayer insulating layer 115 is exposed. Since the first seal 300 is applied inside the hole h, the first seal 300 has a height corresponding to the distance between the upper surface of the interlayer insulating layer 115 and the second substrate 200.

The second seal 400 is formed at the outer side of the first seal 300 and is spaced apart from the first seal 300 by the predetermined interval after applying the first seal 300 on the first substrate 100 and curing the first seal 300.

The second seal 400 may be formed of an organic material, such as epoxy resin, and improves the sealing effect between the first and second substrates 100 and 200 together with the first seal 300. Further, the second seal 400 blocks the inflow of moisture and oxygen from the environment and improves the mechanical strength between the first and second substrates 100 and 200 so as to protect against impact.

By way of summation and review, as OLED displays are manufactured to be larger, the area of the fit for sealing the two substrates increases, and thus the size of the non-display area increases, increasing the difficulty in implementing thin profiled displays. Further, due to the fragile material properties of fit, when an impact is applied to the display, stress is concentrated at the contact surface between the frit and the substrate, leading to the generation of cracks at the contact surface, thereby degrading the reliability of the display.

According to at least one embodiment, the first seal is formed of frit and is formed between the display area and the non-display area and the second seal is formed of epoxy resin and is formed on the driver so as to be located at the outer side of the first seal and to overlap the driver. Accordingly, the mechanical strength of the substrates is improved thereby protecting the OLED display from impact. Example embodiments have been disclosed herein, and although specific terms are employed, they are used and are to be interpreted in a generic and descriptive sense only and not for the purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A method of fabricating an organic light-emitting diode (OLED) display, comprising:
    providing a first substrate including a display area and a peripheral area surrounding the display area;
    forming a first metal pattern on the peripheral area;
    forming an insulating layer over the first metal pattern;
    forming a second metal pattern overlapping the first metal pattern over the insulating layer;
    forming a passivation layer over the second metal pattern;
    patterning the passivation layer so as to surround the first and second metal patterns;
    forming a conductive layer over the patterned passivation layer and on opposing sides of the patterned passivation layer in the peripheral area;
    patterning the conductive layer to expose a portion of the passivation layer; forming a first seal in the peripheral area;
    forming a second seal at least partially overlapping the exposed portion of the passivation layer and surrounding the first seal;
    attaching a second substrate to the first substrate; and
    curing the second seal.

2. The method of claim 1, wherein the first and second seals are formed of different materials.

3. The method of claim 1, wherein the first seal is formed of glass frit.

4. The method of claim 1, wherein the second seal is formed of an epoxy resin.

5. The method of claim 1, further comprising forming an OLED in the display area, wherein the OLED includes a pixel electrode and wherein the conductive layer is formed of the same material as the pixel electrode.

6. The method of claim 1, wherein the attaching comprises irradiating laser light onto the first seal.

7. The method of claim 6, wherein the irradiating comprises burning the passivation layer located under the first seal so that a hole is formed exposing a portion of the insulating layer and wherein the first seal is located inside the hole.

* * * * *